(12) United States Patent
Chang et al.

(10) Patent No.: US 11,164,771 B1
(45) Date of Patent: Nov. 2, 2021

(54) WAFER TRANSFERRING DEVICE

(71) Applicant: Powertech Technology Inc., Hsinchu County (TW)

(72) Inventors: Cheng Chang, Hsinchu County (TW); Ming Hsiu Hsieh, Hsinchu County (TW); Yuan-Jung Lu, Hsinchu County (TW); Chu Yuan Mo, Hsinchu County (TW); Fu-Hsiang Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/090,843

(22) Filed: Nov. 5, 2020

(30) Foreign Application Priority Data

Sep. 16, 2020   (TW) ................ 109131896

(51) Int. Cl.
  *B25J 15/06* (2006.01)
  *H01L 21/683* (2006.01)
  *B25J 11/00* (2006.01)
  *B25J 15/00* (2006.01)

(52) U.S. Cl.
  CPC ....... *H01L 21/6838* (2013.01); *B25J 11/0095* (2013.01); *B25J 15/0033* (2013.01); *B25J 15/0616* (2013.01); *B25J 15/0683* (2013.01)

(58) Field of Classification Search
  None
  See application file for complete search history.

(56) References Cited

U.S. PATENT DOCUMENTS

| | | | |
|---|---|---|---|
| 6,499,777 B1 * | 12/2002 | Wang ............. | C30B 35/005 118/728 |
| 2015/0352726 A1 * | 12/2015 | Harter ............. | B25J 15/0691 294/185 |
| 2016/0067867 A1 * | 3/2016 | Harter ............. | B65G 47/91 294/188 |

FOREIGN PATENT DOCUMENTS

| | | | | |
|---|---|---|---|---|
| CN | 102136444 | | 7/2011 | |
| CN | 102136444 A | * | 7/2011 | ......... H01L 21/6838 |

OTHER PUBLICATIONS

"Office Action of Taiwan Counterpart Application", dated May 17, 2021, p. 1-p. 3.

* cited by examiner

*Primary Examiner* — Gerald McClain
(74) *Attorney, Agent, or Firm* — JCIPRNET (57) ABSTRACT

A wafer transferring device adapted to suck and transfer a first wafer is provided. The wafer transferring device includes an arm and a supporting carrier. The supporting carrier is connected to the arm. The supporting carrier has a single vacuum suction port exposed to an upper surface of the supporting carrier. The supporting carrier is adapted to move to a position below the first wafer. The single vacuum suction port is adapted to suck a first central region of the first wafer so as to lift up and transfer the first wafer.

19 Claims, 7 Drawing Sheets

WAFER TRANSFERRING DEVICE

CROSS-REFERENCE TO RELATED APPLICATION

This application claims the priority benefit of Taiwan application serial no. 109131896, filed on Sep. 16, 2020. The entirety of the above-mentioned patent application is hereby incorporated by reference herein and made a part of this specification.

BACKGROUND

Technical Field

The invention relates to a transferring device, and particularly relates to a wafer transferring device.

Description of Related Art

In a conventional wafer transferring process, the wafer is generally sucked and transferred by a plurality of vacuum suction nozzles disposed on a transferring device. However, due to improvement of the existing wafer manufacturing process, a thickness of the wafer gradually becomes smaller, and the wafer is more likely to be warped. The warped wafer may not be able to contact the vacuum nozzles at the same time, and is difficult to be sucked stably, thereby affecting stability of transportation.

SUMMARY

The invention is directed to a wafer transferring device, which is capable of stably transferring a warped wafer.

The invention provides a wafer transferring device adapted to suck and transfer a first wafer. The wafer transferring device includes an arm and a supporting carrier. The supporting carrier is connected to the arm. The supporting carrier has a single vacuum suction port exposed to an upper surface of the supporting carrier. The supporting carrier is adapted to move to a position below the first wafer. The single vacuum suction port is adapted to suck a first central region of the first wafer so as to lift up and transfer the first wafer.

In an embodiment of the invention, the supporting carrier includes a substrate, a sealing ring located on the substrate, and a first flexible member changeably disposed above the substrate and the sealing ring, the substrate includes a first hole, the sealing ring has a second hole aligned with the first hole, the first flexible member has a third hole aligned with the second hole, and the first hole, the second hole and the third hole commonly form the single vacuum suction port.

In an embodiment of the invention, a first peripheral region of the first wafer is higher than the first central region to present a warping shape, and a thickness of the first flexible member is greater than a height difference between the first peripheral region and the first central region of the first wafer.

In an embodiment of the invention, when the supporting carrier lifts up the first wafer, the supporting carrier contacts the first central region and the first peripheral region of the first wafer, and a deformation amount of the first flexible member at a place corresponding to the first central region of the first wafer is greater than a deformation amount of the first flexible member at a place corresponding to the first peripheral region of the first wafer.

In an embodiment of the invention, the wafer transferring device is also adapted for sucking and transferring a second wafer. A second peripheral region of the second wafer is higher than a second central region to present a warping shape, a height difference between the second peripheral region and the second central region of the second wafer is greater than the height difference between the first peripheral region and the first central region of the first wafer, the supporting carrier further includes a second flexible member for replacing the first flexible member, a thickness of the second flexible member is greater than the thickness of the first flexible member and greater than the height difference between the second peripheral region and the second central region of the second wafer.

In an embodiment of the invention, the sealing ring is located on the substrate at a place corresponding to the first hole, the supporting carrier further includes a flat member located beside the sealing ring, and the flat member is located between the substrate and the first flexible member.

In an embodiment of the invention, the flat member surrounds an outer side of the sealing ring and has a same height as the sealing ring.

In an embodiment of the invention, a material of the flat member includes heat-resistant rubber.

In an embodiment of the invention, a hardness of the flat member is greater than a hardness of the first flexible member.

In an embodiment of the invention, the supporting carrier includes a base portion and at least one supporting arm extending from the base portion, the single vacuum suction port penetrates through the base portion, the at least one supporting arm is adapted for carrying the first peripheral region of the first wafer.

In an embodiment of the invention, the at least one supporting arm does not have a vacuum suction port exposed to the upper surface.

In an embodiment of the invention, the at least one supporting arm includes two supporting arms, and the two supporting arms and the base portion present a U-shape.

In an embodiment of the invention, the at least one supporting arm extends to a direction away from the arm.

In an embodiment of the invention, a thickness of a central part of the first flexible member close to the third hole is equal to a thickness of a peripheral part of the first flexible member away from the third hole.

In an embodiment of the invention, a thickness of a central part of the first flexible member close to the third hole is smaller than a thickness of a peripheral part of the first flexible member away from the third hole.

In an embodiment of the invention, the first flexible member contacts the substrate directly.

In an embodiment of the invention, the first flexible member comprises a notch next to the third hole and concaved from a surface of the first flexible member facing toward the substrate.

In an embodiment of the invention, the sealing ring is located in the notch of the first flexible member.

In an embodiment of the invention, the sealing ring is a suction nozzle.

In an embodiment of the invention, a material of the first flexible member comprises acrylic foam.

Based on the above description, in the design of the wafer transferring device of the invention, the supporting carrier has the single vacuum suction port, and since the wafer transferring device uses the single vacuum suction port to suck the first wafer, during a process that the wafer transferring device lifts up and transfers the first wafer, a vacuum degree between the single vacuum suction port and the first wafer is capable of being maintained well, so that the wafer transferring device may stably transfer the first wafer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
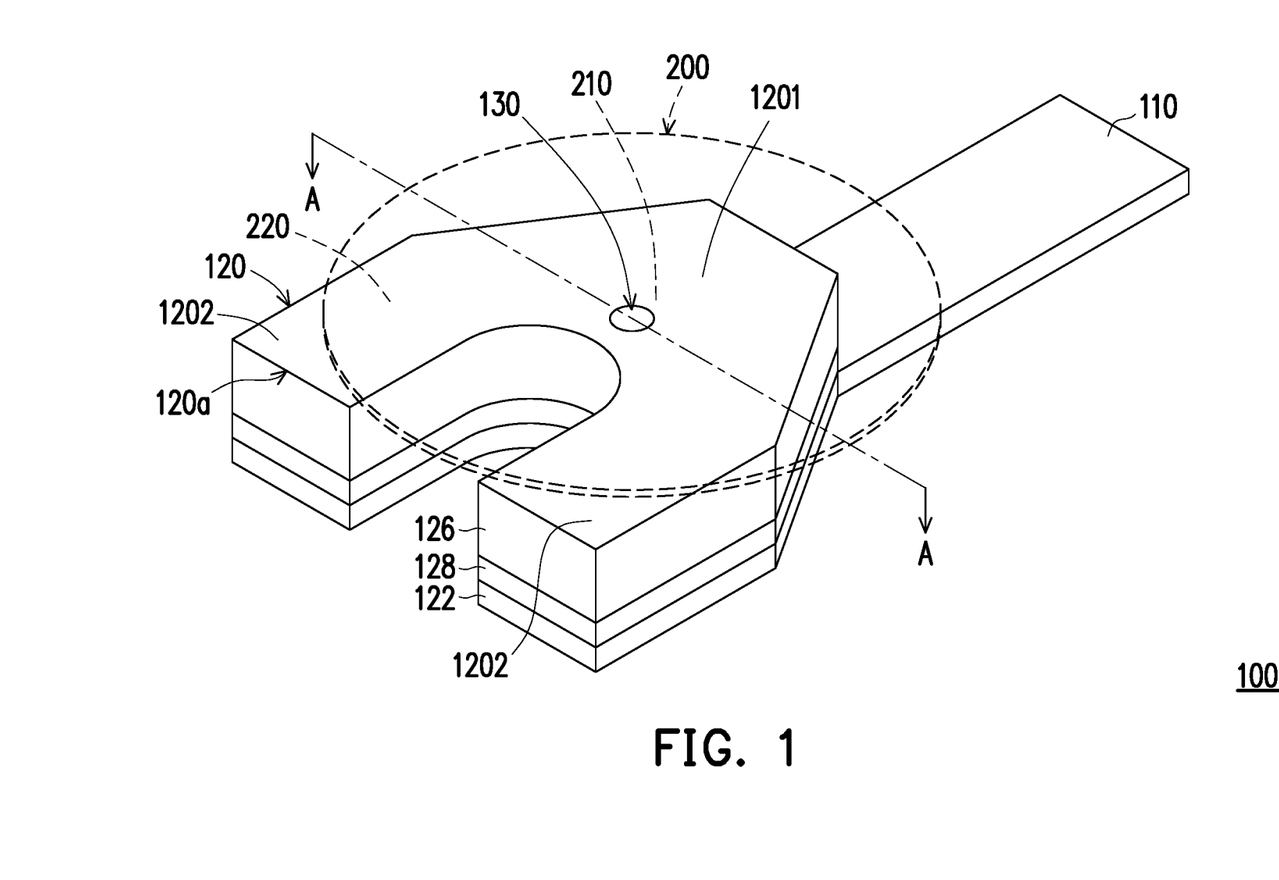
FIG. 1 is a schematic three-dimensional view of a wafer transferring device applied to a first wafer according to an embodiment of the invention.
Figure 2A:
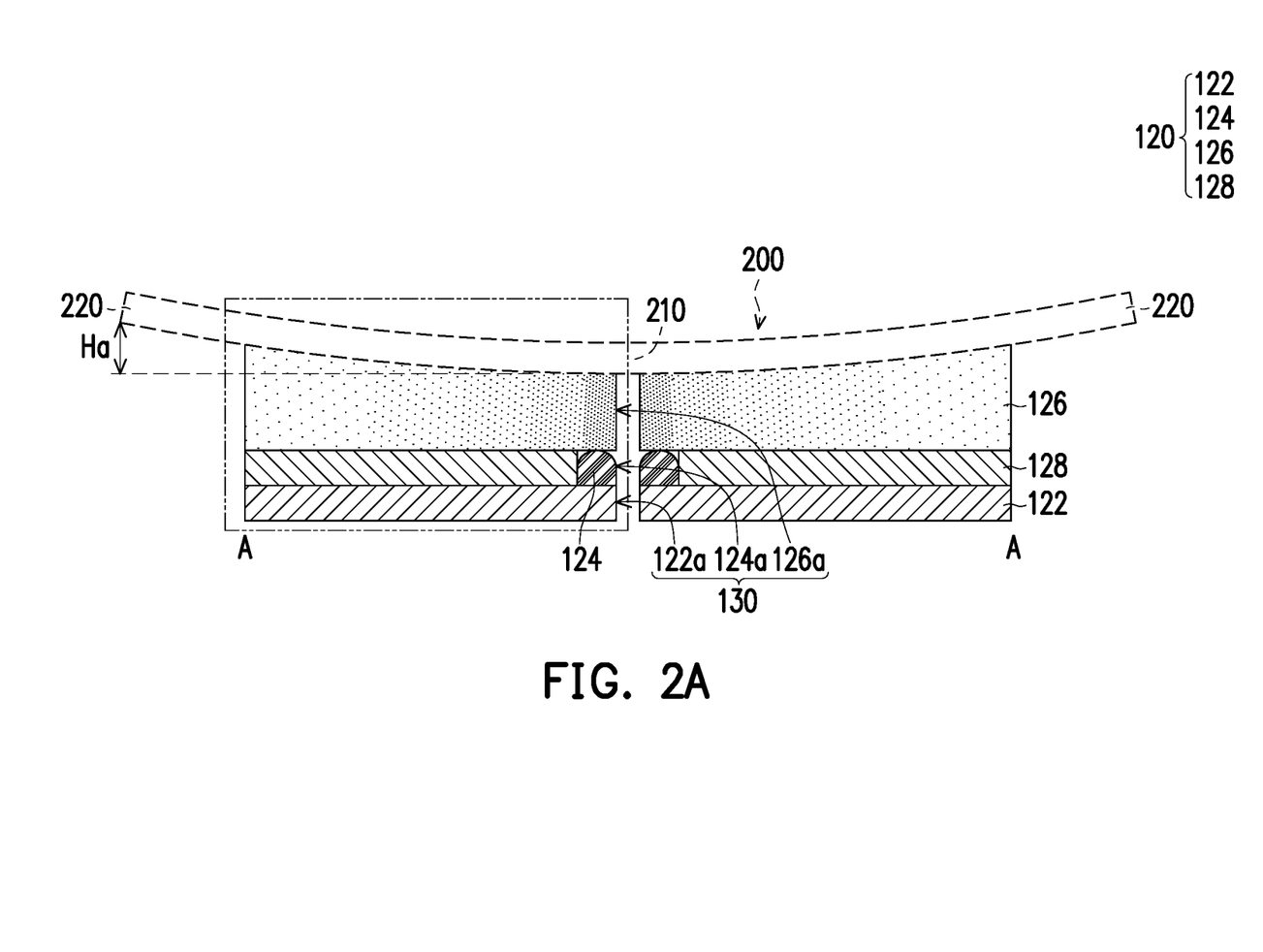
FIG. 2A is a schematic cross-sectional view of the wafer transferring device of FIG. 1 applied to the first wafer along a line A-A.

FIG. 1 is a schematic three-dimensional view of a wafer transferring device applied to a first wafer according to an embodiment of the invention. FIG. 2A is a schematic cross-sectional view of the wafer transferring device of FIG. 1 applied to the first wafer along a line A-A. Referring to FIG. 1 and FIG. 2A, the wafer transferring device 100 of the embodiment is adapted to suck and transfer a first wafer 200. It should be noted that the first wafer 200 in FIG. 1 and FIG. 2A is drawn with dashed lines in order to more clearly illustrate a structure of the wafer transferring device 100. In addition, proportional relationships of sizes and thicknesses between the wafer transferring device 100 and the first wafer 200 in the figures are only schematic.

Referring to FIG. 1, in the embodiment, the wafer transferring device 100 includes an arm 110 and a supporting carrier 120. The supporting carrier 120 is connected to the arm 110. The supporting carrier 120 has an upper surface 120a, and includes a base portion 1201 and at least one supporting arm 1202 extending from the base portion 1201. A single vacuum suction port 130 is exposed to the upper surface 120a of the supporting carrier 120 and penetrates through the base portion 1201 of the supporting carrier 120. The at least one supporting arm 1202 extends to a direction away from the arm 110. In addition, in the embodiment, the at least one supporting arm 1202 of the supporting carrier 120 includes two supporting arms 1202, and the two supporting arms 1202 and the base portion 1201 present a U shape, but the invention is not limited thereto.

In the embodiment, the wafer transferring device 100 is adapted to suck and transfer the first wafer 200. To be specific, when the wafer transferring device 100 is to transfer the first wafer 200, the arm 110 drives the supporting carrier 120 to move to a position below the first wafer 200. At this time, the single vacuum suction port 130 provided on the supporting carrier 120 is adapted to suck a lower surface of a first central region 210 of the first wafer 200, and meanwhile the at least one supporting arm 1202 of the supporting carrier 120 carries a first peripheral region 220 of the first wafer 200, so that the supporting carrier 120 may stably lift up and transfer the first wafer 200.

It should be noted that during a process of manufacturing the wafer, the wafer may be warped, for example, a peripheral region of the wafer is higher than a central region to present a shallow dish structure, which may result in a fact that the vacuum suction nozzles of the conventional wafer transferring device are unable to contact the warped wafer at the same time, and only one or several vacuum suction nozzles may contact the warped wafer, and there are gaps between the other vacuum suction nozzles and the warped wafer. In this case, since capability of a vacuum machine is fixed, the vacuum suction nozzles that cannot directly contact the wafer continuously suck in air, which indirectly affects a vacuum degree between the wafer and the vacuum suction nozzles that directly contact the wafer. Therefore, even if a part of the vacuum suction nozzles of the conventional wafer transferring device may contact the warped wafer, it may not be able to stably suck and transfer the warped wafer.

In order to avoid the above situation, the supporting carrier 120 of the wafer transferring device 100 of the embodiment only has the single vacuum suction port 130, i.e., there is no vacuum suction port on the supporting arm 1202 exposed to the upper surface 120a of the supporting carrier 120. According to such design, the wafer transferring device 100 may suck the first central region 210 of the first wafer 200 only through the single vacuum suction port 130, so that a vacuum degree between the single vacuum suction port 130 and the first wafer 200 is not affected by other suction nozzles. Therefore, the warped first wafer 200 may be tightly sucked to the single vacuum suction port 130, and the wafer transferring device 100 may stably transfer the warped first wafer 200. The supporting carrier 120 is further introduced below.

Referring to FIG. 2A, in the embodiment, the supporting carrier 120 includes a substrate 122, a sealing ring 124 located on the substrate 122, and a first flexible member 126 changeably disposed above the substrate 122 and the sealing ring 124. The sealing ring 124 may be a general suction nozzle, but the invention is not limited thereto.

In the embodiment, the substrate 122 includes a first hole 122a, the sealing ring 124 has a second hole 124a aligned with the first hole 122a, and the first flexible member 126 has a third hole 126a aligned with the second hole 124a. The first hole 122a, the second hole 124a and the third hole 126a commonly form the single vacuum suction port 130.

In the embodiment, the supporting carrier 120 further includes a flat member 128 located between the substrate 122 and the first flexible member 126. The flat member 128 is configured to provide a flat surface for the first flexible member 126 to be disposed thereon. The sealing ring 124 is located on the substrate 122 at a place corresponding to the first hole 122a, the flat member 128 is located beside the sealing ring 124 and surrounds an outer side of the sealing ring 124, and the flat member 128 and the sealing ring 124 have a same height. In the embodiment, a material of the flat member 128 includes heat-resistant rubber, so that it may be used in a high temperature process environment of the wafer, but the material of the flat member 128 is not limited thereto.

In the embodiment, the first peripheral region 220 of the first wafer 200 is higher than the first central region 210 to present a warping shape. In order to be able to support the first wafer 200 more stably, the wafer transferring device 100 is specifically configured with the first flexible member 126 on a top layer of the supporting carrier 120, and the first flexible member 126 may be compressed or/and flexed. The first flexible member 126 is, for example, acrylic foam, but the material of the first flexible member 126 is not limited thereto. A hardness of the flat member 128 is greater than a hardness of the first flexible member 126.

Figure 2B:
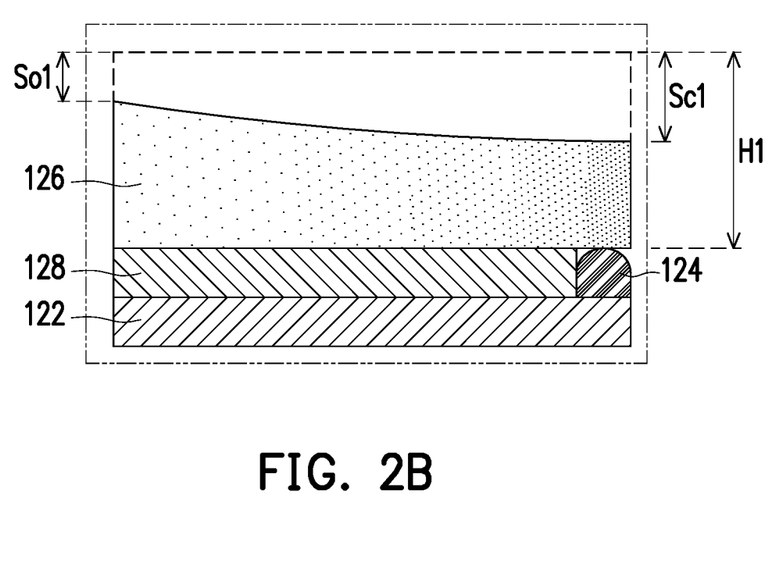
FIG. 2B is a schematic diagram of a partial curve of the wafer transferring device of FIG. 2A carrying the first wafer.

FIG. 2B is a schematic diagram of a partial curve of the wafer transferring device of FIG. 2A carrying the first wafer. It should be noted that the first wafer 200 is omitted in FIG. 2B in order to more clearly illustrate the structure of the wafer transferring device 100, and dashed lines illustrate an uncompressed state of the first flexible member 126 before carrying the first wafer 200.

Referring to FIG. 2A and FIG. 2B, when the supporting carrier 120 lifts up the first wafer 200, a weight of the first wafer 200 may deform the first flexible member 126. In particular, the first flexible member 126 may be deformed according to a shape of the first wafer 200. In the embodiment, a thickness H1 of the first flexible element 126 is greater than a height difference Ha between the first peripheral region 220 and the first central region 210 of the first wafer 200, so that the first flexible element 126 may contact the first peripheral region 220 and the first central region 210 of the first wafer 200 at the same time when carrying the first wafer 200.

In the embodiment, since the first peripheral region 220 of the first wafer 200 is higher than the first central region 210, when the first flexible member 126 carries the first wafer 200, a deformation amount Sc1 of the first flexible member 126 at a place corresponding to the first central region 210 of the first wafer 200 is greater than a deformation amount So1 of the first flexible member 126 at a place corresponding to the first peripheral region 220 of the first wafer 200. Certainly, the relationship of the deformation amounts is not limited thereto.

Therefore, in the embodiment, when the single vacuum suction port 130 of the wafer transferring device 100 sucks the first central region 210 of the first wafer 200, since the first flexible member 126 disposed on the supporting carrier 120 of the wafer transferring device 100 may support the first central region 210 and the first peripheral region 220 of the first wafer 200, the wafer transferring device 100 may not only suck the first wafer 200 through the single vacuum suction port 130, it may also contact and support the first wafer 200 through the first flexible member 126 of the supporting carrier 120, so as to stably transfer the warped first wafer 200 into a wafer chuck for high temperature (HT), room temperature (RT), and low temperature (LT) tests (a temperature range of −10° C.–150° C.).

Figure 3A:
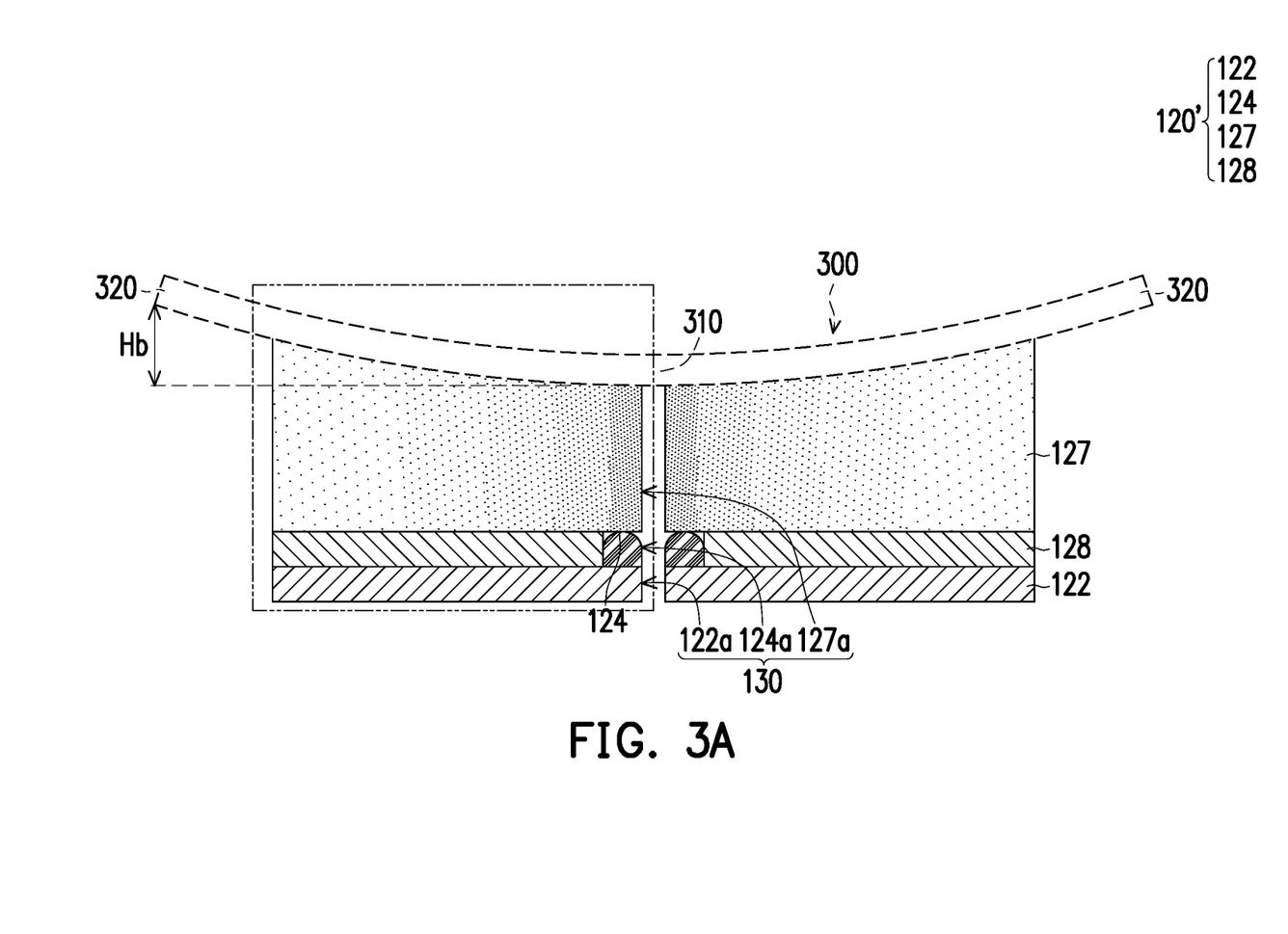
FIG. 3A is a schematic cross-sectional view of a wafer transferring device applied to a second wafer according to an embodiment of the invention.

FIG. 3A is a schematic cross-sectional view of the wafer transferring device applied to a second wafer according to an embodiment of the invention. Referring to FIG. 3A, the wafer transferring device 100 of the embodiment is also adapted for sucking and transferring a second wafer 300. It should be noted that the second wafer 300 in FIG. 3A is shown in dashed lines in order to more clearly illustrate the structure of the wafer transferring device.

In the process of wafer manufacturing in different batches, wafers with different warping degrees may be produced. The wafer transferring device 100 of the embodiment may replace the first flexible member 126 by a second flexible member 127 with a different thickness according to the second wafer 300 with a different warping degree (FIG. 3A). In this way, the wafer transferring device 100 of the invention may suck and transfer the first wafer 200 or the second wafer 300 with different warping degrees, which will be explained below.

As shown in FIG. 3A, in the embodiment, a supporting carrier 120' includes the substrate 122, the sealing ring 124 located on the substrate 122, and a second flexible member 127 changeable disposed above the substrate 122 and the sealing ring 124. Moreover, in the embodiment, the substrate 122 includes the first hole 122a, the sealing ring 124 has the second hole 124a aligned with the first hole 122a, and the second flexible member 127 has a fourth hole 127a aligned with the second hole 124a. The first hole 122a, the second hole 124a and the fourth hole 127a commonly form the single vacuum suction port 130.

In the embodiment, the flat member 128 is located between the substrate 122 and the second flexible member 127. The sealing ring 124 is located on the substrate 122 at a place corresponding to the first hole 122a, the flat member 128 is located beside the sealing ring 124 and surrounds the outer side of the sealing ring 124, and the flat member 128 and the sealing ring 124 have a same height. In the embodiment, the material of the flat member 128 includes heat-resistant colloid, but the invention is not limited thereto.

Figure 3B:
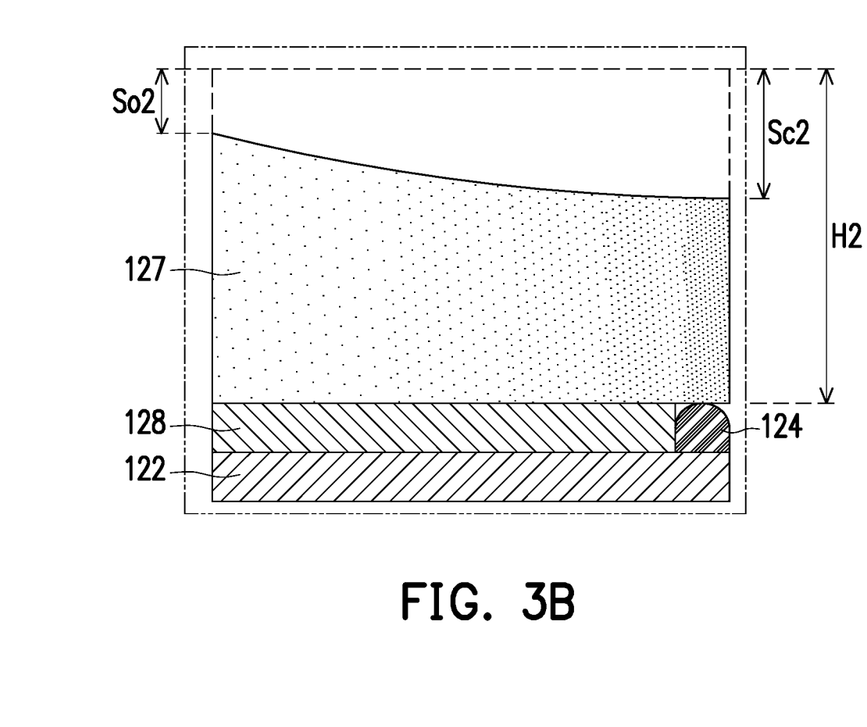
FIG. 3B is a schematic diagram of a partial curve of the wafer transferring device of FIG. 3A carrying the second wafer.

FIG. 3B is a schematic diagram of a partial curve of the wafer transferring device of FIG. 3A carrying the second wafer. It should be noted that the second wafer 300 is omitted in FIG. 3B in order to more clearly illustrate the structure of the wafer transferring device 100, and dashed lines illustrate a state of the second flexible member 127 before carrying the second wafer 300.

Referring to FIG. 3A and FIG. 3B at the same time, in the embodiment, a second peripheral region 320 of the second wafer 300 is higher than a second central region 310 to present a warping shape, and a thickness H2 of the second flexible member 127 is greater than a height difference Hb between the second peripheral region 320 and the second central region 310 of the second wafer 300.

Referring to FIG. 2A to FIG. 3B, a warping degree of the second wafer 300 of FIG. 3A is greater than the warping degree of the first wafer 200 of FIG. 2A. Namely, the height difference Hb between the second peripheral region 320 and the second central region 310 of the second wafer 300 of FIG. 3A is greater than the height difference Ha between the first peripheral region 220 and the first central region 210 of the first wafer 200 of FIG. 2A. Therefore, in the embodiment, the second flexible member 127 with a larger thickness is specifically selected, i.e., the thickness H2 of the second flexible member 127 of FIG. 3B is greater than the thickness H1 of the first flexible member 126 of FIG. 2B, so that the second flexible member 127 may provide greater compression in response to a shape of the second wafer 300.

Therefore, in the embodiment, when the first flexible member 126 lifts up the second wafer 300, a deformation amount Sc2 of the second flexible member 127 at a place corresponding to the second central region 310 of the second wafer 300 is greater than a deformation amount So2 of the second flexible member 127 at a place corresponding to the second peripheral region 320 of the second wafer 300, and the second flexible member 127 of the supporting carrier 120' may contact the second central region 310 and the second peripheral region 320 of the second wafer 300.

Namely, in the embodiment, the wafer transferring device 100 may replace the first flexible member 126 with the second flexible member 127 according to the warping degrees of the first wafer 200 and the second wafer 300. Moreover, based on the above-mentioned adjustable structure, when the single vacuum suction port 130 of the wafer transferring device 100 sucks the first central region 210 of the first wafer 200 or the second central region 310 of the second wafer 300, the first flexible member 126 and the second flexible member 127 with different thicknesses may be respectively used to contact and support the first wafer 200 and the second wafer 300 with different warping degrees. In this way, the wafer transfer device 100 of the invention may stably suck and transfer the first wafer 200 and the second wafer 300 with different warping degrees.

It should be noticed that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 4A:
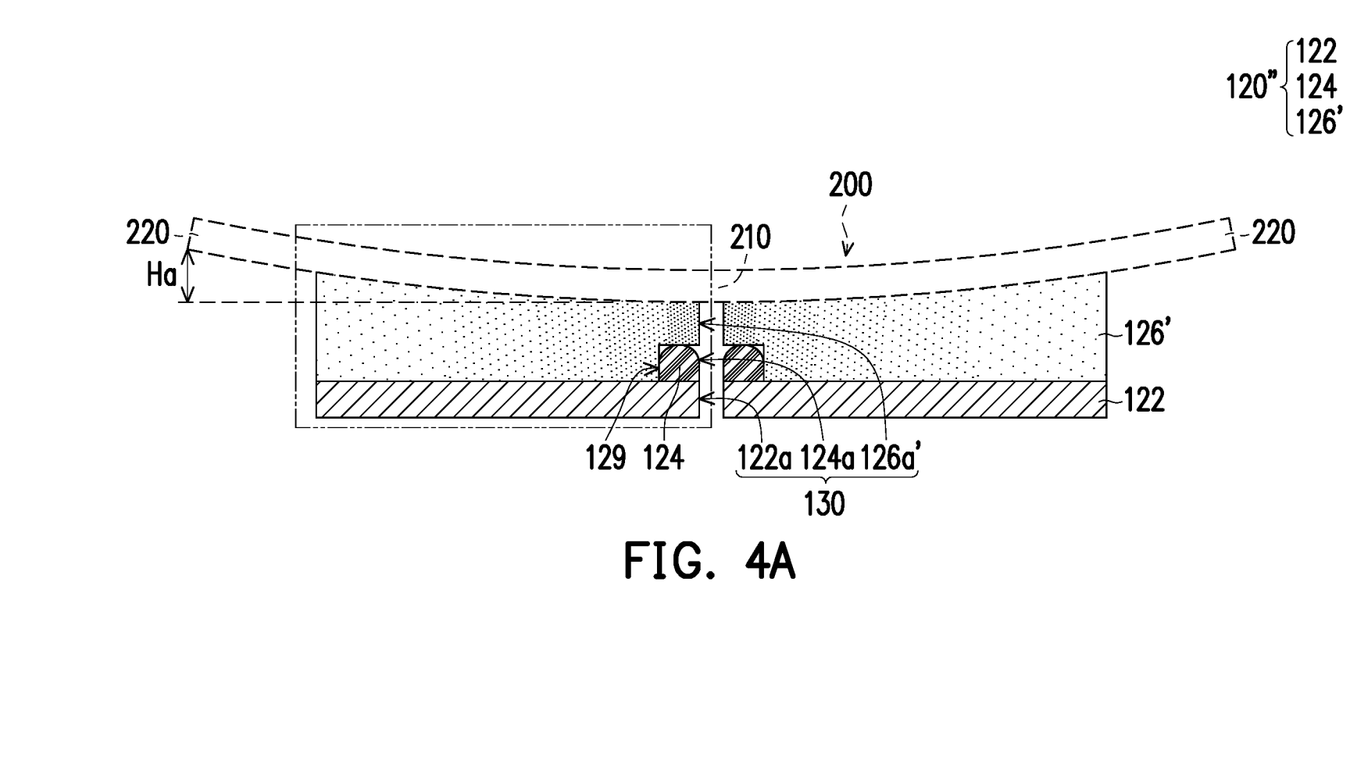
FIG. 4A is a schematic cross-sectional view of a wafer transferring device applied to the first wafer according to another embodiment of the invention.

FIG. 4A is a schematic cross-sectional view of a wafer transferring device carrying the first wafer according to another embodiment of the invention. Referring to FIG. 2A and FIG. 4A, a supporting carrier 120″ of the embodiment is similar to the supporting carrier 120 of FIG. 2A, and a difference there between is that in FIG. 2A, because the flat member 128 and the sealing ring 124 have the same height, whole of the first flexible member 126 can have the same thickness. That is, the thickness of a central part of the first flexible member 126 close to the third hole 126a is equal to the thickness of a peripheral part of the first flexible member 126 away from the third hole 126a. In the embodiment of FIG. 4A, the supporting carrier 120″ does not have the flat member 128, and a first flexible member 126' is directly disposed on the substrate 122 of the supporting carrier 120″.

Referring to FIG. 4A, in the embodiment, a shape of the first flexible member 126' is a sum of the shapes of the first flexible member 126 and the flat member 128 of FIG. 2A, and there is a notch 129 on a wall next to the third hole 126a' and concaved from a surface of the first flexible member 126' facing toward the substrate 122, and the sealing ring 124 is located in the notch 129 of the first flexible member 126'. A thickness of a central part of the first flexible member 126' close to the third hole 126a' is smaller than a thickness of a peripheral part of the first flexible member 126' away from the third hole 126a'. Namely, in the embodiment, the flat member may be omitted, and the supporting carrier 120″ utilizes the first flexible member 126' to provide a flattening and deformable effect.

Similarly, in the embodiment, the substrate 122 includes the first hole 122a, the sealing ring 124 has the second hole 124a aligned with the first hole 122a, and the first flexible member 126' has a third hole 126a' aligned with the second hole 124a. The first hole 122a, the second hole 124a and the third hole 126a' commonly form the single vacuum suction port 130.

Figure 4B:
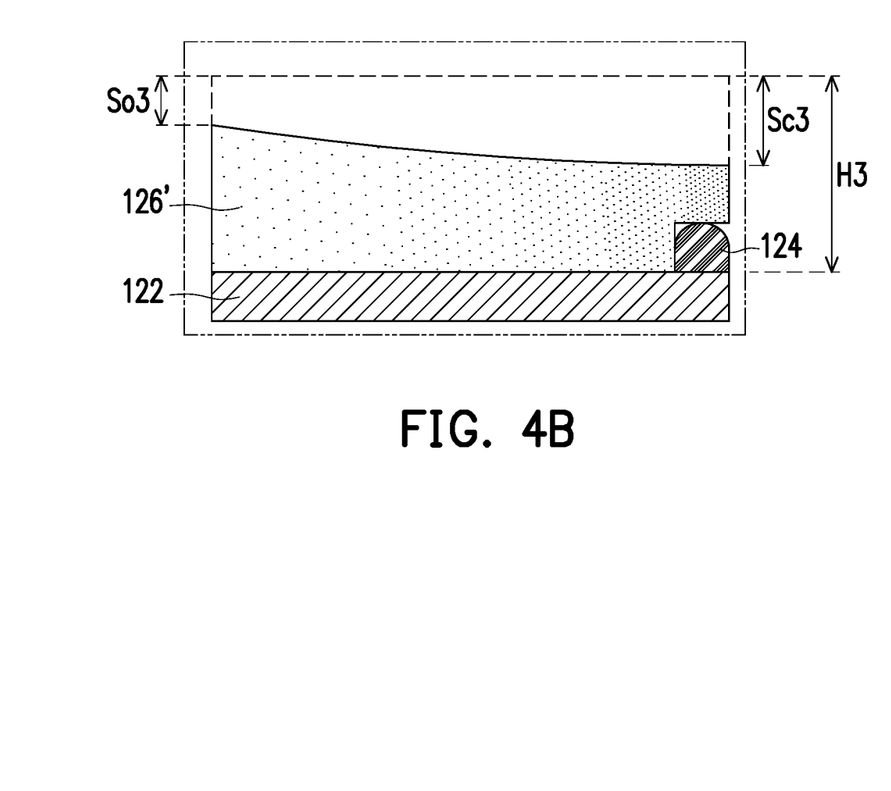
FIG. 4B is a schematic diagram of a partial curve of the wafer transferring device of FIG. 4A carrying the first wafer.

FIG. 4B is a schematic diagram of a partial curve of the wafer transferring device of FIG. 4A carrying the first wafer. It should be noted that the first wafer 200 is omitted in FIG. 4B in order to more clearly illustrate the structure of the wafer transferring device, and dashed lines illustrate a state of the first flexible member 126' before carrying the first wafer 200.

Referring to FIG. 4A and FIG. 4B at the same time, in the embodiment, the second peripheral region 220 of the first wafer 200 is higher than the first central region 210 to present a warping shape, and a thickness H3 of the first flexible member 126' is greater than the height difference Ha between the first peripheral region 220 and the first central region 210 of the first wafer 200.

In the embodiment, when the supporting carrier 120″ lifts up the first wafer 200, the supporting carrier 120″ contacts the first central region 210 and the first peripheral region 220 of the first wafer 200, and a deformation amount Sc3 of the first flexible member 126' at a place corresponding to the first central region 210 of the first wafer 200 is greater than a deformation amount So3 of the first flexible member 126' at a place corresponding to the first peripheral region 220 of the first wafer 200.

Therefore, in the embodiment, when the single vacuum suction port 130 of the wafer transferring device 100 sucks the first central region 210 of the first wafer 200, since the first flexible member 126' disposed on the supporting carrier 120″ of the wafer transferring device 100 may contact and support the first central region 210 and the first peripheral region 220 of the first wafer 200, the wafer transferring device 100 may stably transfer the warped first wafer 200.

In summary, in the design of the wafer transferring device of the invention, the supporting carrier has the single vacuum suction port and the first flexible member, the single vacuum suction port sucks the first central region of the first wafer, and the thickness of the first flexible member is greater than the height difference between the first peripheral region and the first central region of the warped first wafer, so that when the single vacuum suction port sucks the first wafer, the first flexible member may contact and support the first wafer, so as to stably suck and transfer the warped first wafer. In addition, in the wafer transferring device, the first flexible member and the second flexible member with different thicknesses may be exchanged according to the first wafer and the second wafer with different warping degrees, so as to stably absorb and transfer the first wafer and the second wafer with different warping degrees. Therefore, the wafer transferring device of the invention may not only reduce production cost, but may also be widely applied to wafers with different warping degrees.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A wafer transferring device, adapted to suck and transfer a first wafer, the wafer transferring device comprising:
   an arm; and
   a supporting carrier, connected to the arm, and comprising a single vacuum suction port exposed to an upper surface of the supporting carrier, wherein the supporting carrier is adapted to move to a position below the first wafer, and the single vacuum suction port is adapted to suck a first central region of the first wafer so as to lift up and transfer the first wafer;
   wherein the supporting carrier comprises:
   a substrate,
   a sealing ring located on the substrate, and
   a first flexible member changeably disposed above the substrate and the sealing ring,
   the substrate comprises:
   a first hole,
   the sealing ring comprises:
   a second hole aligned with the first hole,
   the first flexible member comprises:

a third hole aligned with the second hole, and the first hole, the second hole and the third hole commonly form the single vacuum suction port.

2. The wafer transferring device as claimed in claim 1, wherein a material of the first flexible member comprises acrylic foam.

3. The wafer transferring device as claimed in claim 1, wherein a first peripheral region of the first wafer is higher than the first central region to present a warping shape, and a thickness of the first flexible member is greater than a height difference between the first peripheral region and the first central region of the first wafer.

4. The wafer transferring device as claimed in claim 3, wherein when the supporting carrier lifts up the first wafer, the supporting carrier contacts the first central region and the first peripheral region of the first wafer, and a deformation amount of the first flexible member at a place corresponding to the first central region of the first wafer is greater than a deformation amount of the first flexible member at a place corresponding to the first peripheral region of the first wafer.

5. The wafer transferring device as claimed in claim 3, wherein the wafer transferring device is further adapted for sucking and transferring a second wafer, a second peripheral region of the second wafer is higher than a second central region of the second wafer to present a warping shape, a height difference between the second peripheral region and the second central region of the second wafer is greater than the height difference between the first peripheral region and the first central region of the first wafer, the supporting carrier further comprises a second flexible member for replacing the first flexible member, a thickness of the second flexible member is greater than the thickness of the first flexible member and greater than the height difference between the second peripheral region and the second central region of the second wafer.

6. The wafer transferring device as claimed in claim 1, wherein the sealing ring is located on the substrate at a place corresponding to the first hole, the supporting carrier further comprises a flat member located beside the sealing ring, and the flat member is located between the substrate and the first flexible member.

7. The wafer transferring device as claimed in claim 6, wherein the flat member surrounds an outer side of the sealing ring and has a same height as the sealing ring.

8. The wafer transferring device as claimed in claim 6, wherein a material of the flat member comprises heat-resistant rubber.

9. The wafer transferring device as claimed in claim 6, wherein a hardness of the flat member is greater than a hardness of the first flexible member.

10. The wafer transferring device as claimed in claim 3, wherein the supporting carrier comprises a base portion and at least one supporting arm extending from the base portion, the single vacuum suction port penetrates through the base portion, the at least one supporting arm is adapted for carrying the first peripheral region of the first wafer.

11. The wafer transferring device as claimed in claim 10, wherein the at least one supporting arm does not have a vacuum suction port exposed to the upper surface.

12. The wafer transferring device as claimed in claim 10, wherein the at least one supporting arm comprises two supporting arms, and the two supporting arms and the base portion present a U-shape.

13. The wafer transferring device as claimed in claim 10, wherein the at least one supporting arm extends to a direction away from the arm.

14. The wafer transferring device as claimed in claim 1, wherein a thickness of a central part of the first flexible member close to the third hole is equal to a thickness of a peripheral part of the first flexible member away from the third hole.

15. The wafer transferring device as claimed in claim 1, wherein a thickness of a central part of the first flexible member close to the third hole is smaller than a thickness of a peripheral part of the first flexible member away from the third hole.

16. The wafer transferring device as claimed in claim 1, wherein the first flexible member contacts the substrate directly.

17. The wafer transferring device as claimed in claim 2, wherein the first flexible member comprises a notch next to the third hole and concaved from a surface of the first flexible member facing toward the substrate.

18. The wafer transferring device as claimed in claim 17, wherein the sealing ring is located in the notch of the first flexible member.

19. The wafer transferring device as claimed in claim 1, wherein the sealing ring is a suction nozzle.

\* \* \* \* \*